Figure 1:
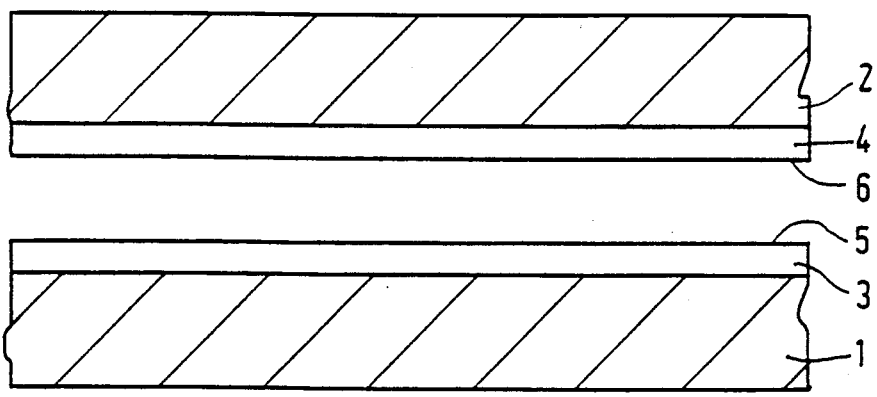
Figure 2:
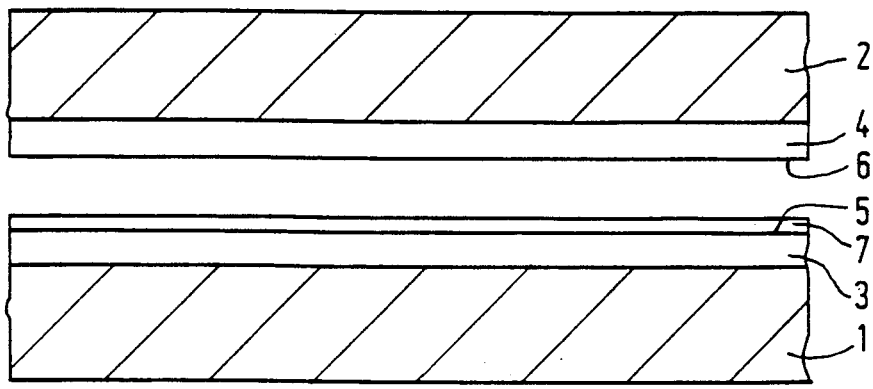
Figure 3:
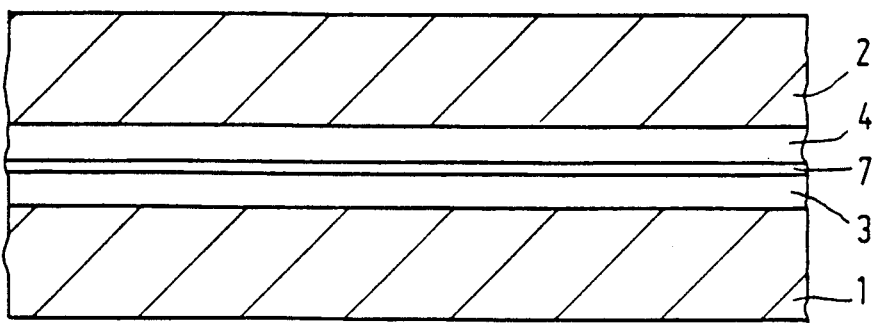
Figure 4:
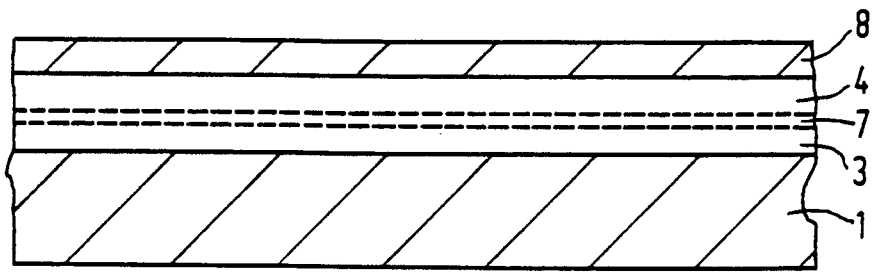

United States Patent [19]

Haisma et al.

[11] Patent Number: 5,054,683

[45] Date of Patent: Oct. 8, 1991

[54] METHOD OF BONDING TOGETHER TWO BODIES WITH SILICON OXIDE AND PRACTICALLY PURE BORON

[75] Inventors: Jan Haisma; Gijsbertus Spierings; Joseph G. Van Lierop; Hendrik F. Van Den Berg, all of Eindhoven, Netherlands

[73] Assignee: U.S. Philips Corporation, New York, N.Y.

[21] Appl. No.: 576,328

[22] Filed: Aug. 29, 1990

[30] Foreign Application Priority Data

Sep. 12, 1989 [NL] Netherlands ............... 8902271

[51] Int. Cl.$^5$ ............ B23K 26/00; B23K 20/00; B23K 20/16
[52] U.S. Cl. ................... 228/198; 228/194; 228/903; 437/974; 148/DIG. 133; 423/278
[58] Field of Search ........... 423/277, 278; 228/194, 228/198, 263.12, 903, 123; 437/921, 982, 974; 148/DIG. 12, DIG. 133

[56] References Cited

U.S. PATENT DOCUMENTS

| | | | |
|---|---|---|---|
| 3,484,302 | 12/1969 | Maeda et al. | 228/194 |
| 3,729,811 | 5/1973 | Beale et al. | 437/31 |
| 3,909,332 | 9/1975 | Yerman | 437/209 |

FOREIGN PATENT DOCUMENTS

| | | | |
|---|---|---|---|
| 64-53763 | 3/1989 | Japan | 228/194 |
| 2081155A | 2/1982 | United Kingdom | 228/194 |

OTHER PUBLICATIONS

Appl. Phys. Lett., "Epitaxial Film Transfer Tech . . . ", vol. 43, No. 3, Aug. 1, 1983, pp. 263–265.
Solid-State Science and Tech., "Low-Temperature Electrostatic Silicon-To-Silicon Seals . . . ", vol. 119, No. 4, Apr. 1972, pp. 545–546.

Primary Examiner—Richard K. Seidel
Assistant Examiner—Jeanne M. Elpel
Attorney, Agent, or Firm—Paul R. Miller

[57] ABSTRACT

A method is set forth bonding of together two bodies (1, 2), according to which a first body (1) is provided with a flat surface (5) and the second body (2) is provided with a silicon oxide layer (4) with a flat surface (6), after which a connecting layer (7) containing boron is provided on at least one of the two flat surfaces. Subsequently, the two bodies (1, 2) are pressed together at elevated temperature, so that a borosilicate glass layer is formed. According to the invention, a layer of practically pure boron is used by way of connecting layer (7). Among the advantages of this is that the composition of the borosilicate glass layer is exclusively determined by the previously chosen layer thickness.

7 Claims, 2 Drawing Sheets

METHOD OF BONDING TOGETHER TWO BODIES WITH SILICON OXIDE AND PRACTICALLY PURE BORON

The invention relates to a method of bonding together a first body and a second body, the first body being provided with a flat surface and the second body being coated with a silicon oxide layer, which is also provided with a flat surface, whereupon a connecting layer comprising boron is applied to at least one of the two flat surfaces and subsequently the first body and the second body are pressed against one another at the flat surfaces during a time at an elevated temperature, after which one of the two bodies is made thin by removal of material.

The connection in this case is made by a borosilicate glass layer which is formed by the reaction at elevated temperature of the connecting layer comprising boron with the silicon oxide layer. A suitable choice of the layer thicknesses makes it possible to achieve a layer of borosilicate glass of such a composition that this layer has a comparatively low or high softening temperature.

By means of the method referred to, a structure is realised comprising a thin layer of material having, for example, semiconductor, magneto-optical, optoelectrical, ferroelectrical, electrically conductive, superconductive, isolating, or photorefractive characteristics and lying on an insulator. The insulator consists of a layer of silicon oxide which contains boron. The two layers are supported by the other body, which was not made thin. This body may be manufactured from, for example, silicon, quartz, sapphire, or a garnet. If silicon is used as the material for the thin layer, such a structure is called SOI (Silicon On Insulator). In such a thin layer of semiconductor material it is possible to provide semiconductor circuits. These circuits have the advantage that they are less prone to interference owing to, for example, "latch up", that they are insensitive to radiation, that the parasitic capacitances are smaller, and that they allow a high circuit density.

A method of the kind mentioned in the opening paragraph is known from the U.S. Patent No. 3,909,332, in which a glass connecting layer of boron oxide and silicon oxide (borosilicate glass) is used for bonding the bodies together. According to the method, two silicon wafers provided with a silicon oxide layer, with a borosilicate glass layer in-between, are pressed against one another with a pressure of approximately $3 \times 10^6 N/m^2$. When the temperature is raised to 900° C., the borosilicate glass layer will start to flow from 500° C., so that borosilicate glass is partly pressed out from between the bodies and caught by means of mica leaves in the press. The remaining borosilicate glass reacts with the silicon oxide layers, forming a different borosilicate glass with a lower boron content than that of the original borosilicate glass. This results in a borosilicate glass having a higher softening temperature than the original borosilicate glass.

The invention has for its object inter alia to provide a method by which a connection is formed between the bodies in a simple way without the connecting layer containing the boron starting to flow. Another object of the invention is inter alia to provide a method by which a stronger bond between the bodies is achieved.

According to the invention, the method of the kind mentioned in the opening paragraph is characterized in that a layer of practically pure boron is used by way of connecting layer. Contrary to borosilicate glass layers, which have a relatively low softening temperature of approximately 500°–800° C., practically pure boron is thermally more stable. Practically pure boron does not melt until at least approximately 2300° C. While the bond is being formed, boron atoms can diffuse from the layer into the silicon oxide layer. These atoms are comparatively mobile because they do not form part of a lattice formed by the silicon/oxygen atoms of the silicon oxide layer. The boron is able to distribute itself over the silicon oxide layer without glass phases having a low softening temperature being created. A bond is thus obtained in which the bonding layer is not pressed out from between the bodies. Among the advantages of this is that the composition of the borosilicate glass layer formed by mixing of the connecting layer with the silicon oxide layer is determined exclusively by the layer thicknesses previously chosen.

Preferably, the method according to the invention is characterized in that the connecting layer of practically pure boron receives a polishing treatment before the first body and the second body are pressed together. This polishing may take place either in a wet chemical or in a wet mechanical process. Preferably, the polishing treatment is so carried out that an optically smooth surface is obtained, because the connection is then activated by van der Waals forces. It should be noted that it is difficult to polish borosilicate glass, contrary to a layer of practically pure boron, without water and other impurities remaining behind in the glass, because this glass is hygroscopic.

A further preferred embodiment of the method according to the invention is characterized in that the layer of practically pure boron has a thickness of between 1 and 200 nm and the silicon oxide layer has a thickness of between 0.01 and 2 $\mu$m. If the thickness of the silicon oxide layer is chosen to be greater than the thickness of the layer of practically pure boron, it is possible to achieve a connection between the bodies without the boron reaching and polluting the adjoining body by diffusion in the silicon oxide layer.

A particular preferred embodiment of the method according to the invention is characterized in that the elevated temperature required for forming the bond is obtained by heating the practically pure boron by means of radiation which is transmitted by the body and absorbed by the layer of practically pure boron. The radiation may be generated by means of, for example, a laser, so that local heating of the boron layer is achieved.

Figure 5:
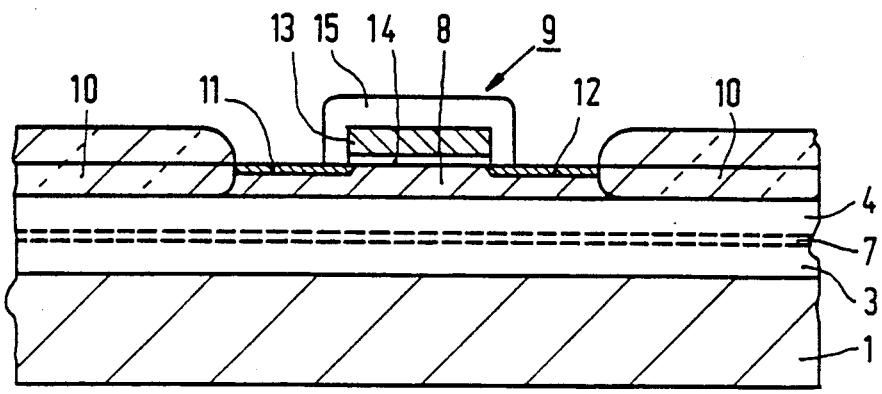
Figure 6:
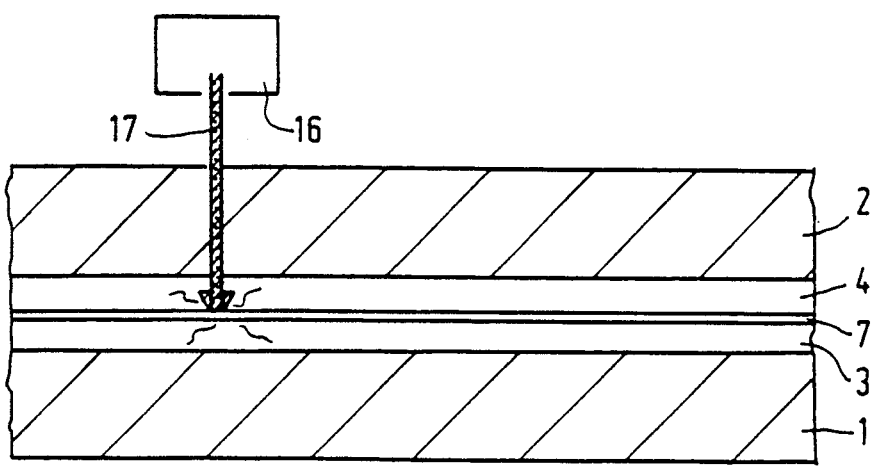

The invention is explained in more detail below, by way of example, with reference to the drawing and a few embodiments. In the drawing:

FIGS. 1, 2, 3 and 4 show a number of stages in the bonding process of two bodies by a method according to the invention, FIG. 5 shows a semiconductor device manufactured by a method according to the invention, a transistor being provided in the thin layer of semiconductor material, and FIG. 6 shows a preferred embodiment of a method according to the invention by which the connection between the two bodies is obtained by means of a laser.

FIGS. 1–4 diagrammatically show a number of stages in the bonding process of two bodies by a method according to the invention, in which the first body 1 is provided with a flat surface 5 and the second body 2 is coated with a silicon oxide layer 4, which is also provided with a flat surface 6, after which a connecting layer 7 containing boron is applied to at least one of the two surfaces 5, 6. Subsequently, the first body 1 and the second body 2 are pressed together at elevated temperature with the flat surfaces 5, 6 for some time, after which one of the two bodies 1, 2 is made thin by removal of material.

The first body 1 and the second body 2 in this example are a support body 1 and a semiconductor body 2, both silicon wafers with a diameter of 7.5 cm and a thickness of 500 μm. Other semiconductor materials than silicon are also possible for the wafers, for example gallium arsenide or indium phosphide, while also the material of the support body 1 does not have to be the same as that of the semiconductor body 2. Thus the support body 1 may also be made from a material other than semiconductor material, such as, for example, glass, sapphire, or a garnet.

The semiconductor body 2 and the support body 1 are both provided with a silicon oxide layer 3, 4, for example by deposition from the gas phase by decomposition at elevated temperature of tetraethoxysilane, FIG. 1. The surface of the silicon dioxide layers 3, 4 is then polished flat. Subsequently, at least one surface 5 of a silicon oxide layer 3 is provided with a connecting layer 7, FIG. 2, after which the semiconductor body 2 and the support body 1 are pressed together with the flat surfaces 5, 6, FIG. 3. After bonding of the bodies 1, 2, the silicon semiconductor body 2 with a thickness of approximately 500 μm is made thin, FIG. 4, for example by isotropic etching back of the semiconductor body 2 until a layer 8 remains having a thickness of approximately 1 μm.

FIG. 5 shows a semiconductor device in which a transistor 9 having lateral dimensions of approximately 4×4 μm is provided in the thin layer of semiconductor material 8. The transistor 9 in this example is a MOSFET transistor comprising a source and a drain zone 11, 12 and a gate 13 of polysilicon with a gate oxide 14 and a gate insulation 15 of silicon oxide. The transistor 9 is bounded by field oxide regions 10 in the thin layer 8, which regions are obtained, for example, by local thermal oxidation of the thin layer 8 during one hour at a temperature of 1050° C. A transistor 9 manufactured in this way is an example of an SOI structure which is not sensitive to latch up, which is insensitive to radiation, and whose parasitic capacitances are low in comparison with other structures.

According to the invention, a layer of practically pure boron is used for the connecting layer 7. Thus a bond is achieved between the bodies without the connecting layer 7 starting to flow out while the bond is being formed. The boron layer 7 may be provided on one or both surfaces 5, 6 of the silicon oxide layers 3, 4 in a usual manner, for example by sputtering.

The boron layer 7 is preferably polished before the semiconductor body 2 and the support body 1 are pressed together. A flatter surface of the connecting layer 7 is obtained in this way, which reduces the risk of mechanical stresses and the formation of dislocations in the semiconductor body 2 during pressing together of the bodies 1, 2. The boron layer 7 may be polished either in a wet chemical or alternatively in a wet mechanical process with the relevant suitable polishing means. If polishing is carried out in such a way that an optically smooth surface of the boron connecting layer 7 is obtained, the bond will be reinforced by van der Waals forces. An optically smooth surface is understood to mean a surface with a roughness below 10 nm. Good results are obtained with the so-called "Syton" polishing method, a combination of both chemical and mechanical etching. Polishing takes place in this case with a colloidal suspension of silicon oxide in a watery solution of sodium hydroxide. The connecting layer 7 is preferably applied on both surfaces 5, 6 of the silicon oxide layers and polished to optical smoothness in order to reinforce the bond with van der Waals forces.

The bodies 1, 2 are pressed against one another with a pressure between $1 \times 10^5$ and $1 \times 10^7$ N/m$^2$ for forming a bond between the semiconductor body 2 and the support body 1. The minimum value for the pressure is approximately $1 \times 10^5$ N/m$^2$ for achieving the bond. On the other hand, the pressure must not exceed $1 \times 10^7$ N/m$^2$, since the mechanical stresses would then become too great. A minimum temperature of 900° C. is required for achieving the bond, the boron entering into a chemical reaction with the silicon oxide layers 3, 4. The reaction takes place at an elevated temperature of 900° C. after approximately four hours in the case of a silicon oxide layer having a thickness of approximately 1 μm, at 950° C. after approximately two hours, at 1000° C. after approximately half an hour, and at 1050° C. after a few minutes.

FIG. 6 shows a preferred embodiment of a method according to the invention, in which the bond between the two bodies 1, 2 is obtained by means of a laser 16. The elevated temperature required for forming the bond is realised here by heating the boron layer 7 locally by means of the laser radiation 17. Heating is continued here until the boron has been absorbed in the silicon oxide layers 3, 4. In this example the laser beam 17 is generated with a solid-state laser of the Yttrium Neodymium Garnet type with an effective radiation power of at least 1 Watt. A suitable wavelength to which this laser may be tuned is 1064 nm. Radiation of this wavelength is substantially completely absorbed by practically pure boron and substantially completely transmitted by materials like silicon oxide and pure silicon.

We claim:

1. A method of bonding together a first body and a second body comprising the steps of
    (a) providing each of a first body and a second body with a flat surface,
    (b) coating said flat surface of at least one of said first body and said second body with a silicon oxide layer,
    (c) providing said silicon oxide layer with a flat surface,
    (d) applying a layer of practically pure boron to at least one of said flat surfaces,
    (e) pressing said first and second bodies together at said flat surfaces for a period of time at an elevated temperature, said layer of practically pure boron being a connecting layer, and then
    (f) removing material from one of said two bodies to make said one body thin.

2. A method as claimed in claim 1, wherein said layer of practically pure boron is polished before said first and second bodies are pressed together.

3. A method as claimed in claim 2, wherein said layer of practically pure boron is polished to an optically smooth surface.

4. A method as claimed in claim 3, wherein said layer of practically pure boron is applied to said flat surfaces at both of said first and second bodies.

5. A method as claimed in claim 1, wherein said step (e) of pressing said first and second bodies together is carried out at a pressure between $1 \times 10^5$ and $1 \times 10^7 N/m^2$, wherein said elevated temperature is between 900° and 1050° C., and wherein said period of time is between at least a few minutes and at most four hours.

6. A method as claimed in claim 1, wherein said layer of practically pure boron has thickness between 1 and 200 nm, and wherein said silicon oxide layer has a thickness between 0.01 and 2 $\mu$m.

7. A method as claimed in claim 1, wherein said elevated temperature is obtained by heating said practically pure boron with radiation, said radiation being transmitted through one of said first and second bodies, and said radiation being absorbed by said layer of practically pure boron.

* * * * *